US009269674B2

(12) United States Patent
Lee et al.

(10) Patent No.: US 9,269,674 B2
(45) Date of Patent: Feb. 23, 2016

(54) INTEGRATED CIRCUIT HAVING ELECTROMAGNETIC SHIELDING CAPABILITY AND MANUFACTURING METHOD THEREOF

(71) Applicant: REALTEK SEMICONDUCTOR CORPORATION, Hsinchu (TW)

(72) Inventors: Chao-Cheng Lee, Hsin-Chu (TW); Wen-Shan Wang, Hsinchu County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/728,830

(22) Filed: Jun. 2, 2015

(65) Prior Publication Data

US 2015/0364429 A1    Dec. 17, 2015

(30) Foreign Application Priority Data

Jun. 17, 2014  (TW) .............................. 103120794 A (51) Int. Cl.
| H01L 23/552 | (2006.01) |
| H01L 23/31 | (2006.01) |
| H01L 23/58 | (2006.01) |
| H01L 23/528 | (2006.01) |
| H01L 23/00 | (2006.01) |
| H01L 23/50 | (2006.01) |
| H01L 21/768 | (2006.01) |
| H01L 21/3205 | (2006.01) |

(52) U.S. Cl.
CPC ........ H01L 23/552 (2013.01); H01L 21/32051 (2013.01); H01L 21/768 (2013.01); H01L 23/50 (2013.01); H01L 23/528 (2013.01); H01L 23/58 (2013.01); H01L 24/03 (2013.01); H01L 24/05 (2013.01); *H01L 2224/0231* (2013.01); *H01L 2224/0237* (2013.01)

(58) Field of Classification Search
CPC . H01L 24/48; H01L 23/3121; H01L 2224/16; H01L 23/3135; H01L 23/552; H01L 2924/01078; H01L 2924/1433; H01L 2224/48227; H01L 2924/3025; H01L 2924/1815; H01L 25/16; H01L 24/45; H01L 2924/00014; H01L 2924/181; H01L 2924/19101; H01L 2924/01047; H01L 2221/68336; H01L 24/97
USPC .................................. 438/114; 257/E21.602
See application file for complete search history.

(56) References Cited

U.S. PATENT DOCUMENTS

| 5,821,604 A | * | 10/1998 | Egawa | .............. | H01L 23/49816 257/659 |
| 6,842,214 B2 | | 1/2005 | Zhang | | |
| 2009/0284947 A1 | * | 11/2009 | Beddingfield | .... | H01L 23/49833 361/818 |

FOREIGN PATENT DOCUMENTS

| CN | 101472454 | 9/2011 |
| EP | 1724833 A2 | 11/2006 |
| TW | 591802 | 6/2004 |
| TW | 200605366 | 2/2006 |
| TW | 200707699 | 2/2007 |
| TW | 201123395 | 7/2011 |
| WO | WO2005109523 A1 | 11/2005 |

OTHER PUBLICATIONS

Office Action dated Jun. 8, 2015 from counterpart Taiwan application 1031200794.
English abstract translation of Office Action dated Jun. 8, 2015 from counterpart Taiwan application 1031200794.
Search report dated Jun. 8, 2015 from counterpart Taiwan application 1031200794.
English abstract translation of TW 201123395.
TW Pub. No. 200707699A is also published as EP1724833A2.
TW Pub. No. 200605366A is also published as WO2005109523A1.
TW Pat. No. 591802 is also published as U.S. Pat. No. 6,842,214B2.
English abstract translation of CN 101472454.

* cited by examiner

*Primary Examiner* — Evan Pert
*Assistant Examiner* — Changhyun Yi
(74) *Attorney, Agent, or Firm* — WPAT, P.C.; Anthony King (57) ABSTRACT

The present invention discloses an integrated circuit having electromagnetic shielding capability and the manufacturing method thereof. An embodiment of the said integrated circuit comprises: a semiconductor circuit structure including a first surface which covers an electromagnetic radiation area; an electromagnetic shielding layer covering the first surface and including at least one contact; and at least one conducting path operable to electrically connect the at least one contact with a steady voltage and thereby shield off the electromagnetic wave from the electromagnetic radiation area, wherein the current running through the electromagnetic shielding layer is zero or less than the maximum current running through the electromagnetic radiation area.

21 Claims, 12 Drawing Sheets

INTEGRATED CIRCUIT HAVING ELECTROMAGNETIC SHIELDING CAPABILITY AND MANUFACTURING METHOD THEREOF

BACKGROUND OF THE INVENTION

1. Field of the Invention

The present invention relates to an integrated circuit and the manufacturing method thereof, especially to an integrated circuit having electromagnetic shielding capability and the manufacturing method thereof.

2. Description of Related Art

Electronic products will generate electromagnetic waves during operation, which may interfere with the normal operation of other devices and cause human health harmful influence. In view of this problem, most countries establish regulations against electromagnetic waves of electronic products, so as to prevent the damage of electromagnetic interference (EMI).

The main component "integrated circuit (IC)" of an electronic product is a major source of electromagnetic waves. In order to prevent the electromagnetic waves of IC from making EMI, some prior art uses soft/hard metal objects or wave-adsorbing materials to cover the packaged IC after it is installed on a circuit board, so that the electromagnetic waves from the IC could be isolated. However, this solution will lead to a high cost and consume a lot of circuit board area and installation space, which is not cost-effective and unfavorable to miniaturization applications.

In consideration of the above, this industry looks forward to a solution capable of preventing EMI without costing too much and consuming too much area and/or volume.

SUMMARY OF THE INVENTION

An object of the present invention is to provide an integrated circuit having electromagnetic shielding capability and the manufacturing method thereof capable of resolving the problems of the prior art.

The present invention discloses an integrated circuit having electromagnetic shielding capability. An embodiment of the integrated circuit comprises: a semiconductor circuit structure including a first surface which covers an electromagnetic radiation area; an electromagnetic shielding layer such as a metal layer covering the first surface and including at least one contact; and at least one conducting path such as a bonding wire operable to electrically connect the at least one contact with a steady voltage and thereby shield off the electromagnetic wave from the electromagnetic radiation area, wherein the current running through the electromagnetic shielding layer is zero or less than the maximum current running through the electromagnetic radiation area. For instance, the current running through the electromagnetic shielding layer is less than one-Nth of the said maximum current in which the N could be 10 or a value capable of preventing the electromagnetic shielding layer from generating effectual electromagnetic wave. In the above-mentioned embodiment, the steady voltage is a grounding voltage, a high DC voltage or a low DC voltage; in an alternative embodiment, the variation of the steady voltage within a unit period is less than a predetermined value.

The present invention also disclose an integrated circuit manufacturing method having electromagnetic shielding capability. An embodiment of the method comprises the following steps: forming a semiconductor circuit structure including a first surface which covers an electromagnetic radiation area; forming an electromagnetic shielding layer which covers the first surface and includes at least one contact; and forming at least one conducting path operable to electrically connect the at least one contact with a steady voltage and thereby shield off the electromagnetic wave from the electromagnetic radiation area, wherein the current running through the electromagnetic shielding layer is zero or less than the maximum current running through the electromagnetic radiation area.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this invention field. If any term is defined in the description, such term should be explained accordingly. Besides, the connection between objects or events in the embodiments of this specification can be direct or indirect provided that these embodiments are still applicable under such connection. Said "indirect" means that an intermediate object or a physical space is existed between the objects, or an intermediate event or a time interval is existed between the events. In addition, the following description relates to an integrated circuit and the manufacturing method thereof, and the details of the circuit and method that have been well known in this field will be omitted if such details have little to do with the features of the present invention. Furthermore, the shape, size, and ratio of any element and the step sequence of any flow chart in the figures of this specification are just exemplary for understanding, not limitations in the scope of this invention.

The present invention comprises an integrated circuit having electromagnetic shielding capability and the manufacturing method thereof. The said integrated circuit and manufacturing method are capable of resolving the problem of electromagnetic interference (EMI) in a cost-effective and space-saving manner. Provided that an alternative means is available and reasonable, people of ordinary skill in the art can use such means similar or equivalent to that described in this specification to carry out the present invention. The integrated circuit of the present invention could be a fully packaged device or a device needing to be packaged, and may include well known element(s). The detail of such known element(s) will be properly omitted provided that this omission nowhere dissatisfies the disclosure and enablement requirements. In addition, the method of the present invention could be carried out by utilizing an existing or self-developed semiconductor manufacturing process.

Figure 1:
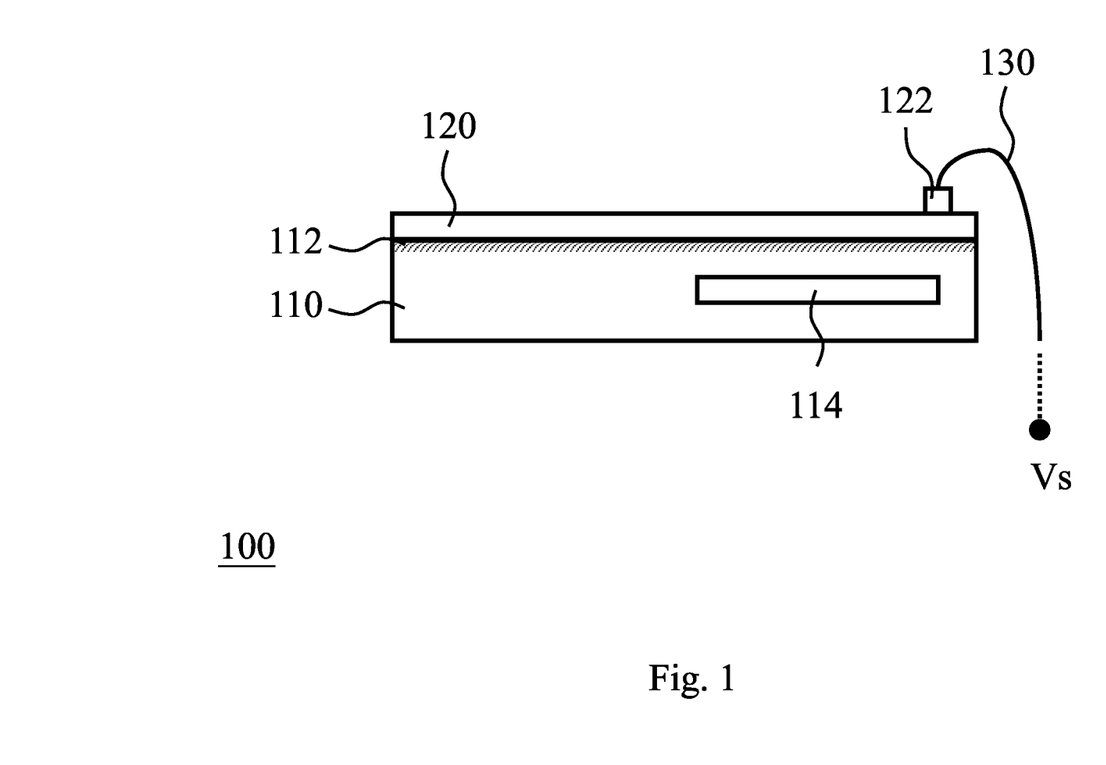
FIG. 1 illustrates an embodiment of the integrated circuit having electromagnetic shielding capability of the present invention.

Please refer to FIG. 1 which illustrates an embodiment of the integrated circuit having electromagnetic shielding capability of the present invention. As it is shown in FIG. 1, the integrated circuit 100 comprises: a semiconductor circuit structure 110, an electromagnetic shielding layer 120 and at least one conducting path 130. The said semiconductor circuit structure 110 could be a known or self-designed structure, including a first surface 112 which could be some or the total surface of the semiconductor circuit structure 110 and covers an electromagnetic radiation area 114 of the semiconductor circuit structure 110. The electromagnetic radiation area 114 could be a conductor (e.g., a straight line conductor) through which a current is running or could be an area including such the conductor. The said electromagnetic shielding layer 120 could be a metal layer, a wave-adsorbing layer, a composite layer of metal and wave-adsorbing material or the like, covering the first surface 112 and including at least one contact 122. In this embodiment, the at least one contact 122 is not electrically connected with any circuit (especially any heavily power-consuming circuit) of the semiconductor circuit structure 110; in an alternative embodiment, the at least one contact 122 is merely electrically connected with some voltage-steady circuit (e.g., electrostatic discharge (ESD) circuit) of the semiconductor circuit structure 110, wherein the electrical connection excludes a connection passing through a ground. The said at least one conducting path 130 such as a bonding wire or its equivalent is operable to electrically connect the at least one contact 122 with a steady voltage Vs and thereby keep the voltage of the electromagnetic shielding layer 120 at the steady voltage Vs to shield off the electromagnetic wave from the electromagnetic radiation area 114, wherein the steady voltage Vs is a grounding voltage (e.g., a signal ground, a.k.a., system ground, or a chassis ground) or a low-frequency voltage (i.e., a voltage, e.g., a DC high voltage VDD or a DC low voltage VSS from a power supply, whose variation within a predetermined period is lower than a predetermined value) and the current running through the electromagnetic shielding layer 120 is zero or less than the maximum current running through the electromagnetic radiation area 114. For instance, the current running through the electromagnetic shielding layer 120 is less than one-Nth of the said maximum current in which the N could be 10 or a value capable of preventing the electromagnetic shielding layer 120 from generating significant electromagnetic wave that is not negligible.

Figure 2A:
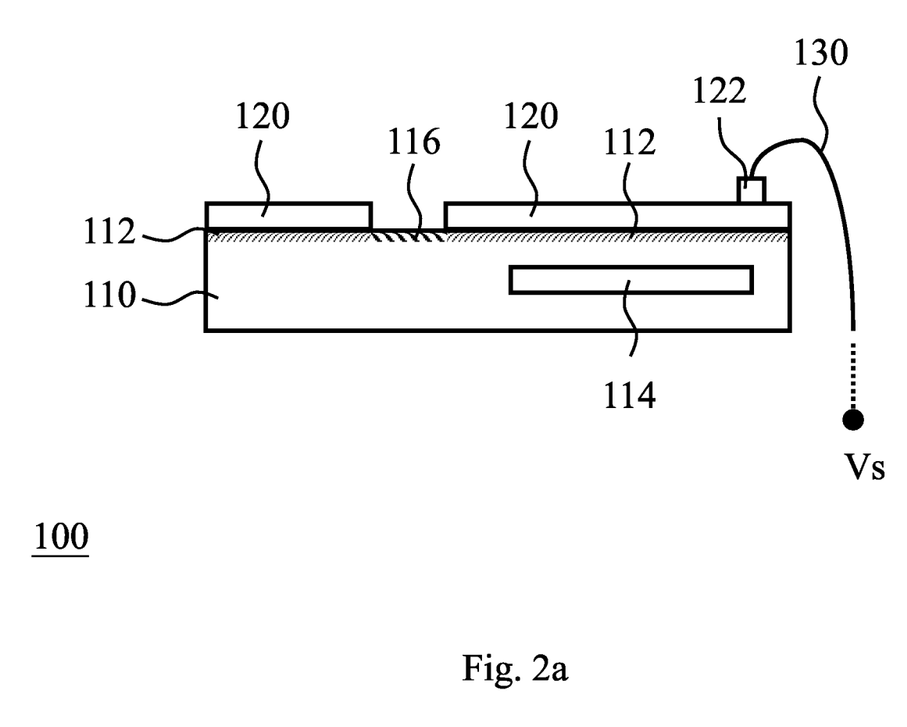
FIG. 2a illustrates an exemplary implementation based on the embodiment of FIG. 1.
Figure 2B:
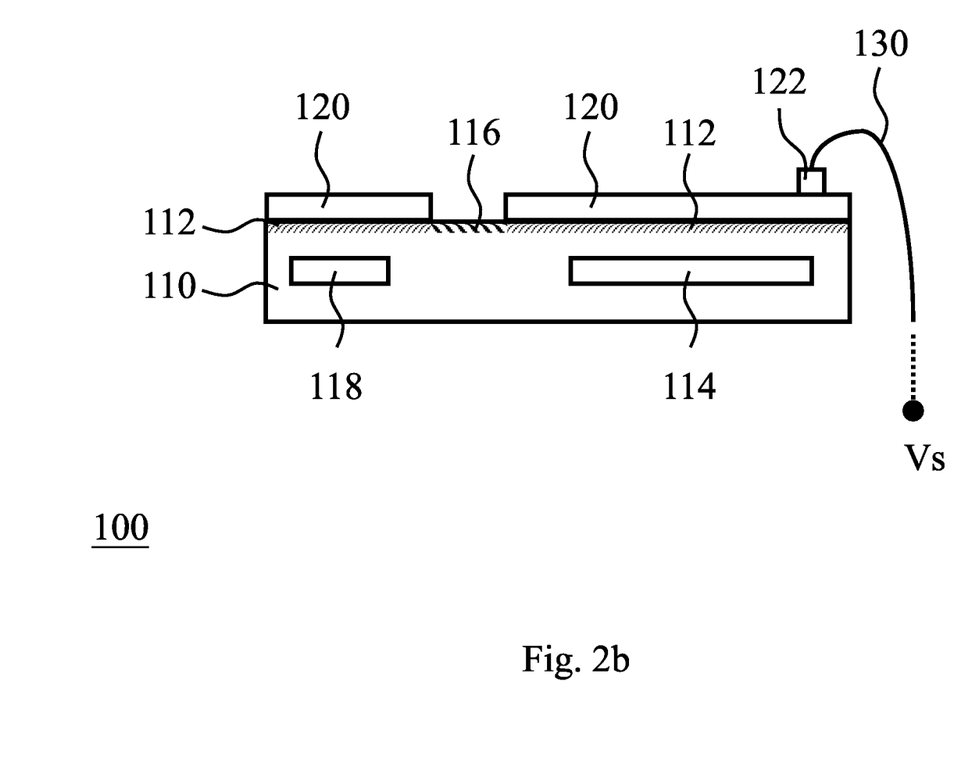
FIG. 2b is another exemplary implementation based on the embodiment of FIG. 1.

Please refer to FIG. 2a which illustrates an exemplary implementation based on the embodiment of FIG. 1. As it is shown in FIG. 2a, the semiconductor circuit structure 110 includes not only the first surface 112 but also a second surface 116 which is not covered with the electromagnetic shielding layer 120. In other words, in consideration of performance or other design requirements, the area (e.g., a radio-frequency circuit area or an electromagnetic-wave-free area) that is covered with the second surface 116 will not be covered with the electromagnetic shielding layer 120. Please refer to FIG. 2b which illustrates another exemplary implementation based on the embodiment of FIG. 1. As it is shown in FIG. 2b, the first surface 112 covers not only the electromagnetic radiation area 114 but also an electromagnetic-wave-free area 118, which means that the electromagnetic shielding layer 120 is allowed to cover an electromagnetic radiation area and/or an electromagnetic-wave-free area.

Figure 3A:
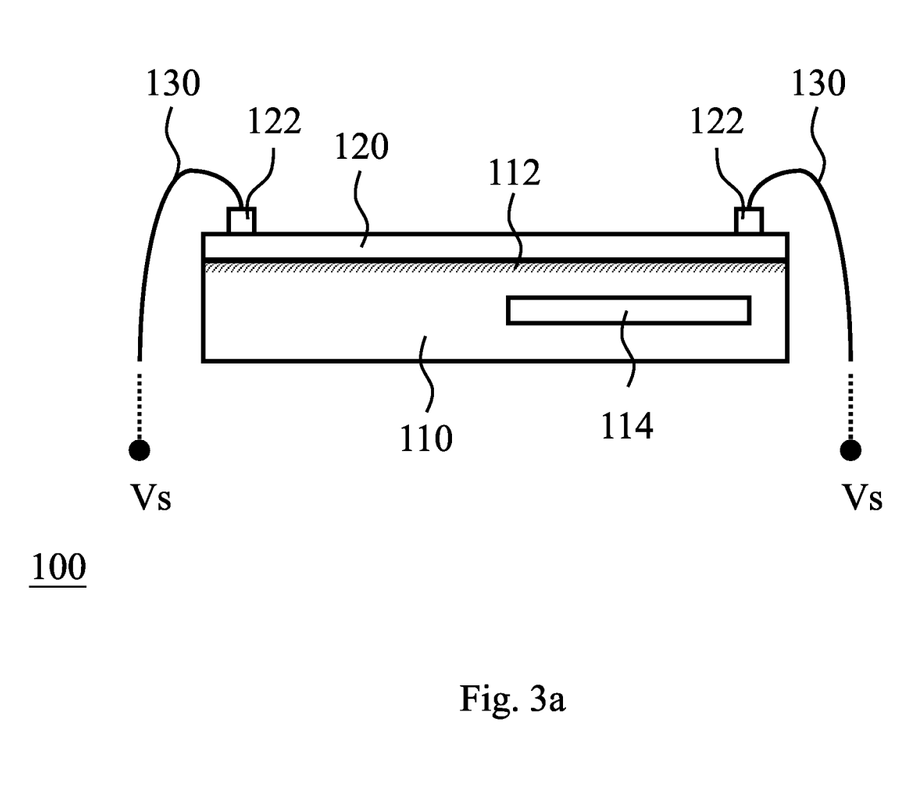
FIG. 3a illustrates an exemplary implementation based on the embodiment of FIG. 1.
Figure 3B:
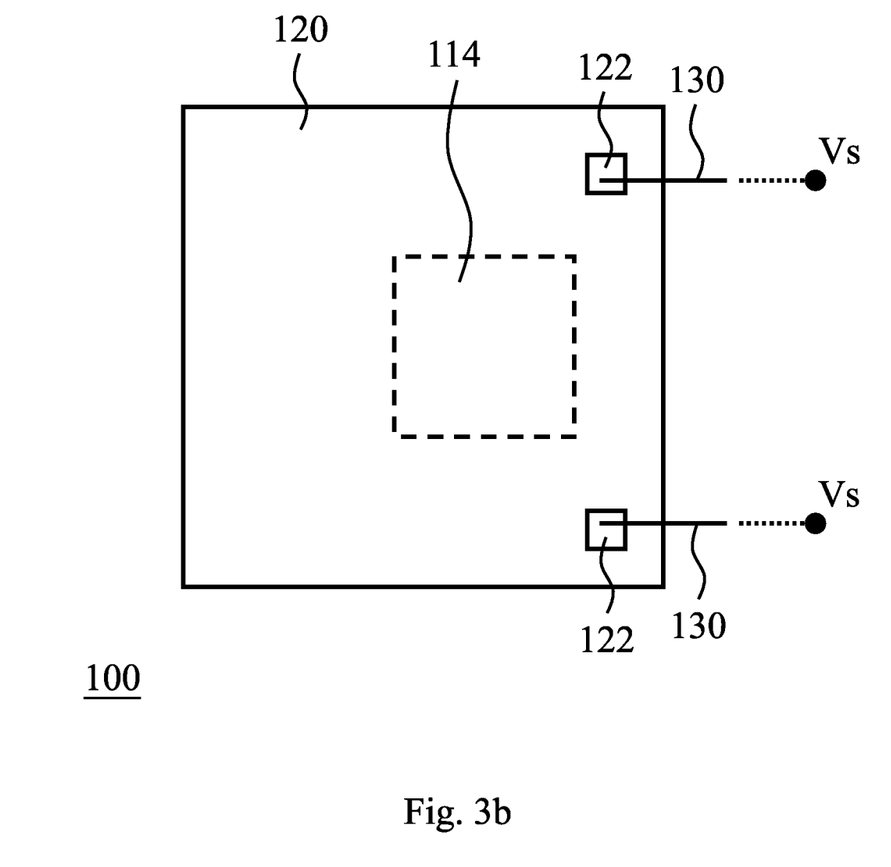
FIG. 3b is another exemplary implementation based on the embodiment of FIG. 1.
Figure 3C:
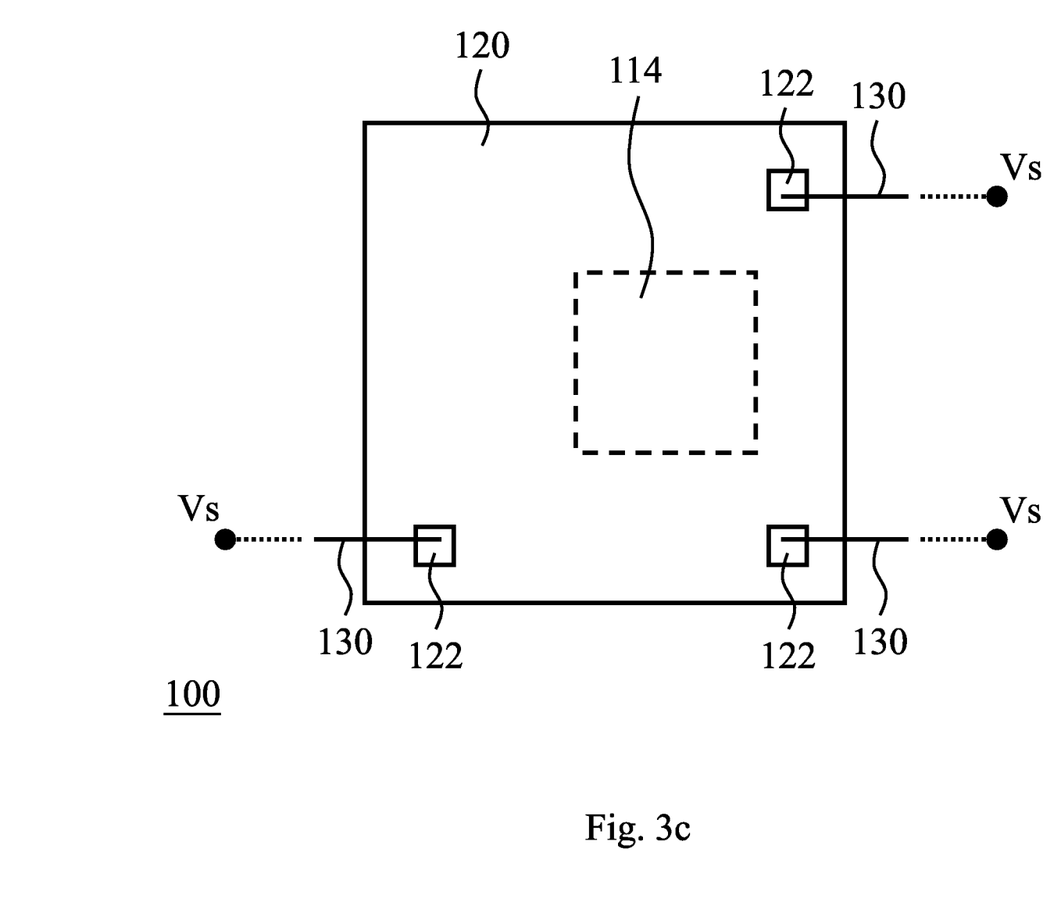
FIG. 3c is yet another exemplary implementation based on the embodiment of FIG. 1.
Figure 3D:
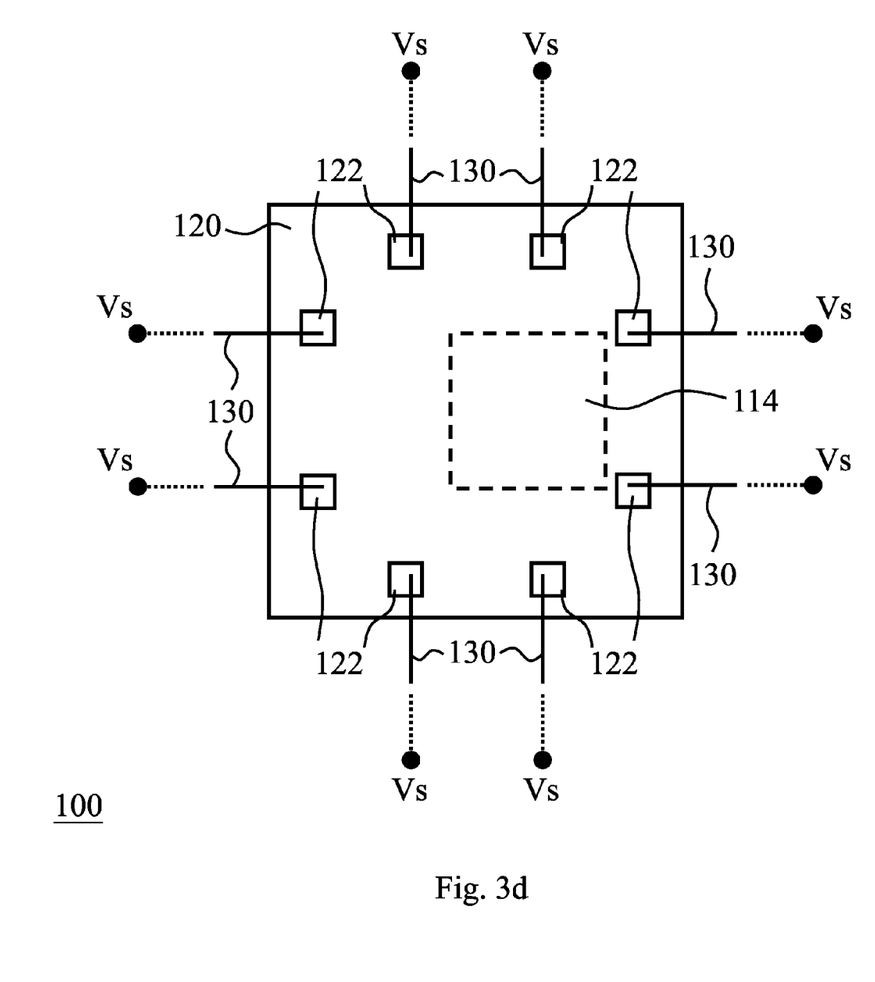
FIG. 3d is a further exemplary implementation based on the embodiment of FIG. 1.

Please refer to FIG. 3a which also illustrates an exemplary implementation based on the embodiment of FIG. 1. As it is shown FIG. 3a, there are a plurality of contacts 122 and a plurality of conducting paths 130; in the meantime the plurality of contacts 122 is electrically connected with the steady voltage Vs through the plurality of conducting paths 130, so as to ensure the voltage of the electromagnetic shielding layer 120 steady and enhance the electromagnetic shielding effect. Please note that the conducting paths 130 may connect with the steady voltage Vs directly, or may include an impedance composed of one or any combination of bead, inductor, capacitor, resistor as a partial path between the contacts 122 and the steady voltage Vs. Similar modifications can be derived by those carrying out the present invention in accordance with their demands. In addition, the layout of the plurality of contacts 122 may be determined by people of ordinary skill in the art in light of their demands or design requirements. For instance, as it is shown in FIG. 3b, the electromagnetic shielding layer 120 includes several sides while at least two of the contacts 122 are formed at the same side of the several sides. In another scenario, as it is shown in FIG. 3c, the plurality of contacts 122 are distributed over at least two of the several sides of the electromagnetic shielding layer 120. In yet another scenario, as it is shown in FIG. 3d, each side of the electromagnetic shielding layer 120 includes at least two of the contacts 122.

Figure 4:
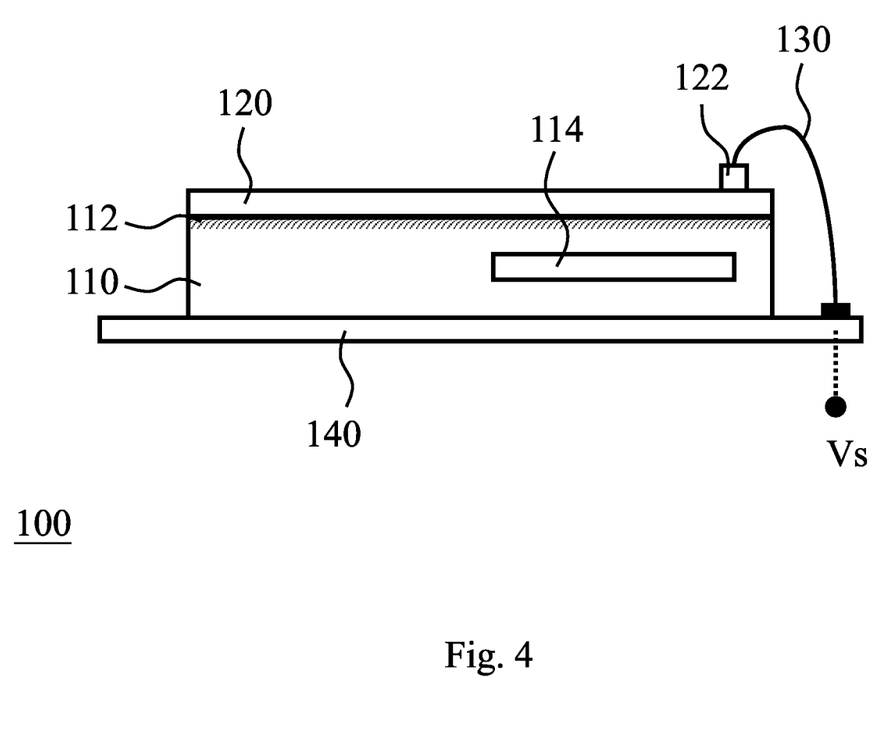
FIG. 4 illustrates an exemplary implementation based on the embodiment of FIG. 1.

Please refer to FIG. 4 which illustrates an exemplary implementation based on the embodiment of FIG. 1. As it is shown in FIG. 4, the integrated circuit 100 further comprises: an exposed pad (EPad) 140 which is fixed to the semiconductor circuit structure 110 directly or through at least one intermediate layer (e.g., an insulating adhesive layer) and operable to electrically connect with the steady voltage Vs; meanwhile, at least one conducting path 130 is operable to electrically connect at least one contact 122 with the exposed pad 140 and thereby make the at least one contact 122 be electrically connected with the steady voltage Vs through the exposed pad 140. Please note that in this implementation the exposed pad 140 and an electrically conducting surface (e.g., copper foil) of a circuit board are joined together, so that heat dissipation and electrical connection with a ground (i.e., the steady voltage Vs) of the circuit board can be realized, in which the circuit board is independent of the integrated circuit 100. Please further note that in this implementation the integrated circuit 100 is packaged through a Quad Flat No Leads (QFN) packaging process or the equivalent thereof, or through a packaging process capable of realizing the aforementioned connection and effect.

Figure 5A:
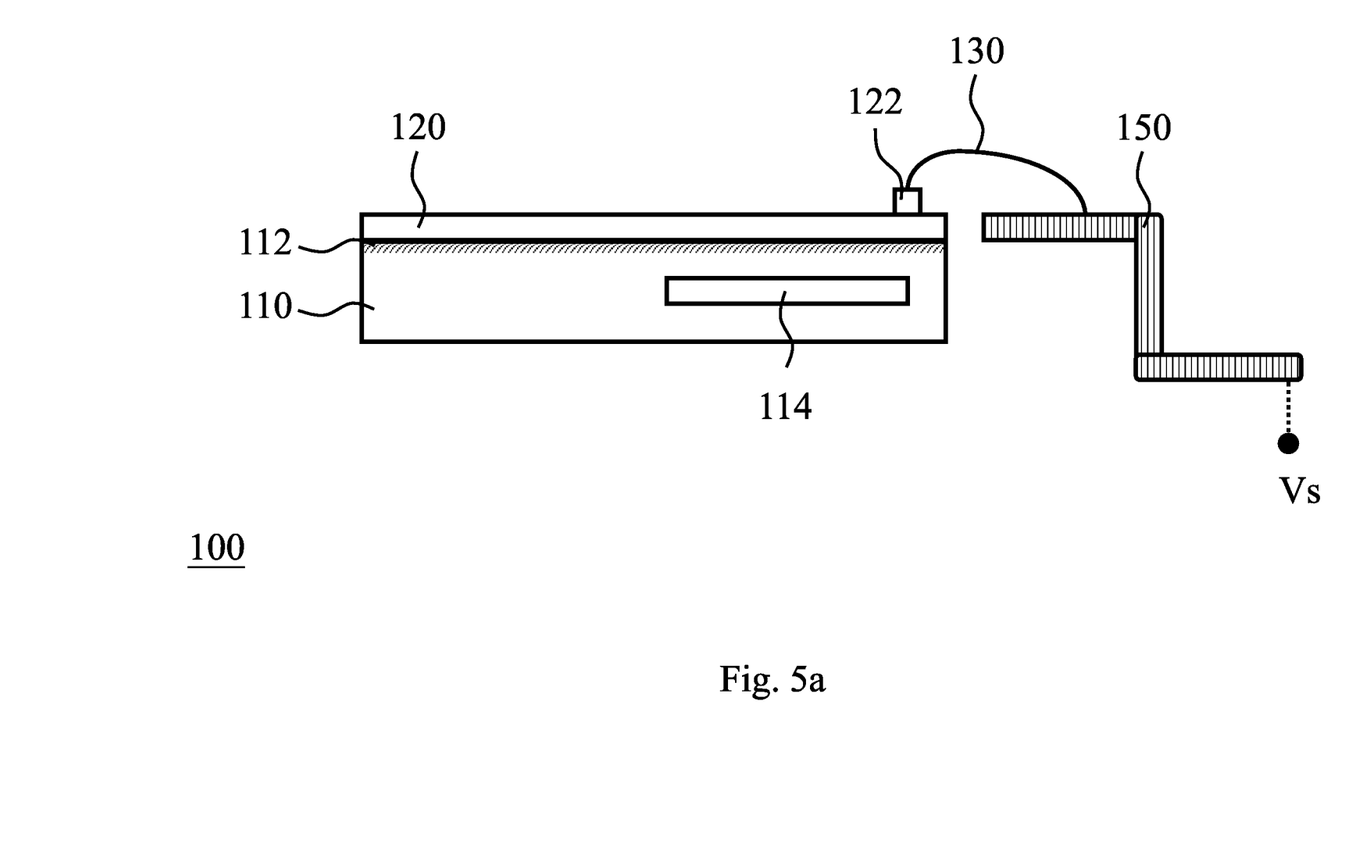
FIG. 5a illustrates an exemplary implementation based on the embodiment of FIG. 1.
Figure 5B:
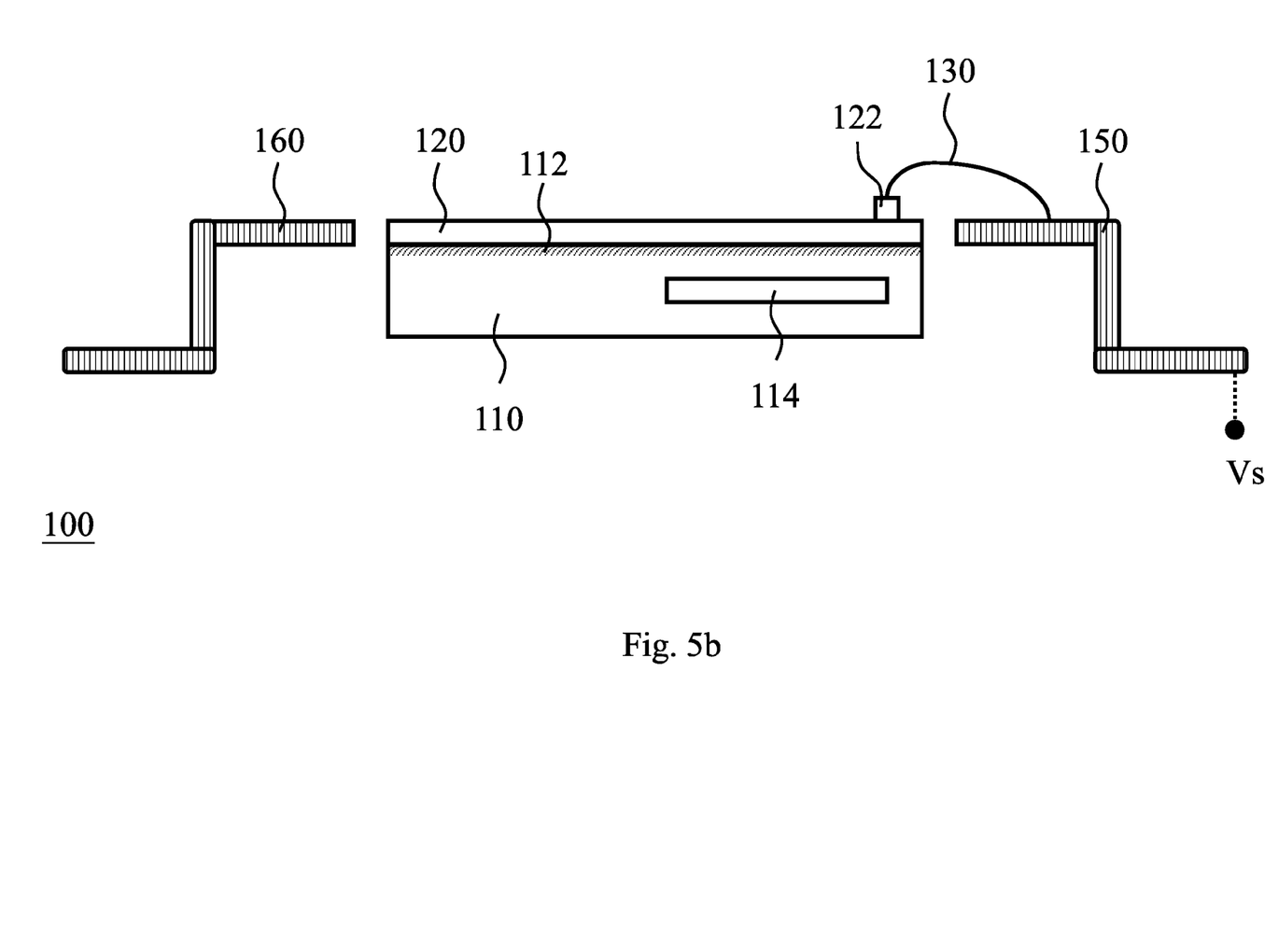
FIG. 5b is another exemplary implementation based on the embodiment of FIG. 1.

Please refer to FIG. 5a which illustrates an exemplary implementation based on the embodiment of FIG. 1. As it is shown in FIG. 5a, the integrated circuit 100 further comprises: at least one electromagnetic shielding pin 150 operable to electrically connect with the steady voltage Vs while at least one conducting path 130 is operable to electrically connect at least one contact 122 with the at least one electromagnetic shielding pin 150 to thereby make the at least one contact 122 be electrically connected with the steady voltage Vs through the at least one electromagnetic shielding pin 150. In another scenario, as it is shown in FIG. 5b, the integrated circuit 100 further comprises a grounding pin 160 which is different from the at least one electromagnetic shielding pin 150 and operable to be coupled to a grounding voltage. More specifically, since the voltage of the grounding pin 160 might be affected by the operation of the integrated circuit 100 and become unstable in comparison with the steady voltage Vs, the scenario of FIG. 5b makes use of one or more independent electromagnetic shielding pin 150 different from the grounding pin 160 to connect the at least one contact 122 of the electromagnetic shielding layer 120 with the steady voltage Vs. However, in yet another scenario, the electromagnetic shielding pin and the grounding pin could be the same as long as the electromagnetic shielding effect is acceptable. Please note that the integrated circuit 100 in this implementation is packaged through one of a Quad Flat Package (QFP) packaging process, a Ball Grid Array (BGA) packaging process and a Flip Chip packaging or through the equivalent of any of these processes. Of course other packaging processes that is able to achieve the required connection and effect can be adopted by the present invention.

Figure 5C:
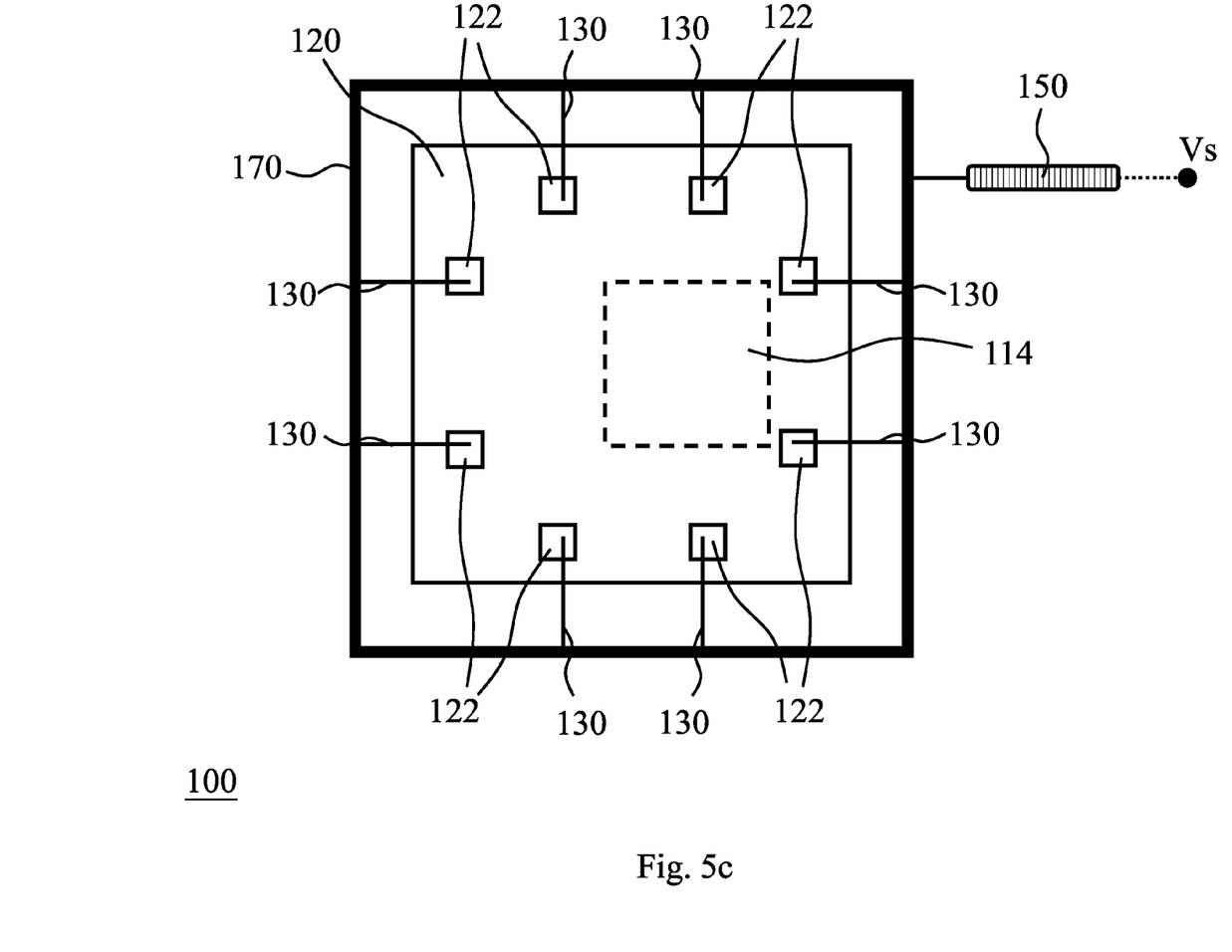
FIG. 5c is yet another exemplary implementation based on the embodiment of FIG. 1.

Please refer to FIG. 5c. In order to prevent consuming too many pins, the integrated circuit 100 comprises not only the elements of FIG. 5a but also a conductor (e.g. metal) 170 formed at one or more sides of the electromagnetic shielding layer 120 and operable to electrically connect with the at least one contact 122 through the at least conducting path 130 and electrically connect with the at least one electromagnetic shielding pin 150. In FIG. 5c, the conductor 170 is a conducting ring surrounding the periphery of the electromagnetic shielding layer 120 and located at a level/plane the same as or different from the level/plane of the electromagnetic shielding layer 120, and is operable to electrically connect with the plurality of contacts 122 through the plurality of conducting paths 130 and electrically connect with a single electromagnetic shielding pin 150, so that the contacts 122 are allowed to electrically connect with the steady voltage Vs through the conducting path 130, the conductor 170 and the single electromagnetic shielding pin 150. Therefore it is no longer necessary to use a plurality of electromagnetic shielding pins corresponding to the plurality of contacts 122. Please note that although a single electromagnetic shielding pin 150 is taken for example in FIG. 5c, those carrying out the present invention may use more than one electromagnetic shielding pins according to their demands or design requirements.

In the above embodiments, the electromagnetic shielding layer 120 and a redistribution layer (RDL) may pertain to the same level/layer, if practicable. In other words, the two layers are formed through the same process, or the two layers are realized through one multifunctional layer. Since the formation and application of the redistribution layer is well known in this field, the detail thereof is therefore omitted. Besides, as it is described in the preceding paragraphs, the electromagnetic shielding layer 120 could be a metal layer, and in order to prevent the metal layer from oxidation or erosion, the present invention may use an appropriate material (e.g., aluminum) to form the metal layer, implant appropriate substances (e.g., aluminum, magnesium, titanium and etc.) into a major material (e.g., copper) to form the metal layer, or form a protection layer (e.g., alumina film, titanium nitride or the like) to protect the metal layer. Other similar means could be used for making or protecting the electromagnetic shielding layer 120 of the present invention. In addition, in the above embodiments the electromagnetic shielding layer 120 is the outmost layer (i.e., the topmost metal layer, the bottommost metal layer, or the most outside metal layer) among all metal layers of the integrated circuit 100, which implies that the electromagnetic shielding layer 120 is formed through the last metal layer process; however, this is just exemplary for understanding, not restrictive for the present invention. More specifically, the outermost metal layer of a general integrated circuit is usually a power and ground mesh which will be limited to its mesh structure and thus incapable of generating an effectual image current in response to the current of the electromagnetic radiation area 114 for electromagnetic wave neutralization. Even though the power and ground mesh may generate an uncompleted image current, this image current and the current of the electromagnetic radiation area 114 can't be well synchronized at the same time and in the same direction for electromagnetic wave neutralization. In other words, the power and ground mesh itself has significant current running therethrough, and thus the electromagnetic wave generated therefrom can't be negligible and offset. In view of the above concern, though the integrated circuit 100 of the fore-discussed embodiments might comprise a power and ground mesh because of design requirements, the mesh should be at a layer different from the electromagnetic shielding layer 120 and the area of the electromagnetic shielding layer 120 should be larger than the area of the power and/or ground mesh, or the power and ground mesh and the electromagnetic shielding layer 120 may be located at the same layer but electrically separated from each other, or a part of the power and ground mesh (e.g., the power mesh or the ground mesh) or all of the mesh is equivalent to or included in the electromagnetic radiation area 114. In brief, the electromagnetic shielding layer 120 is different from a power and ground mesh, and capable of restraining the electromagnetic wave from the power and ground mesh.

Figure 6:
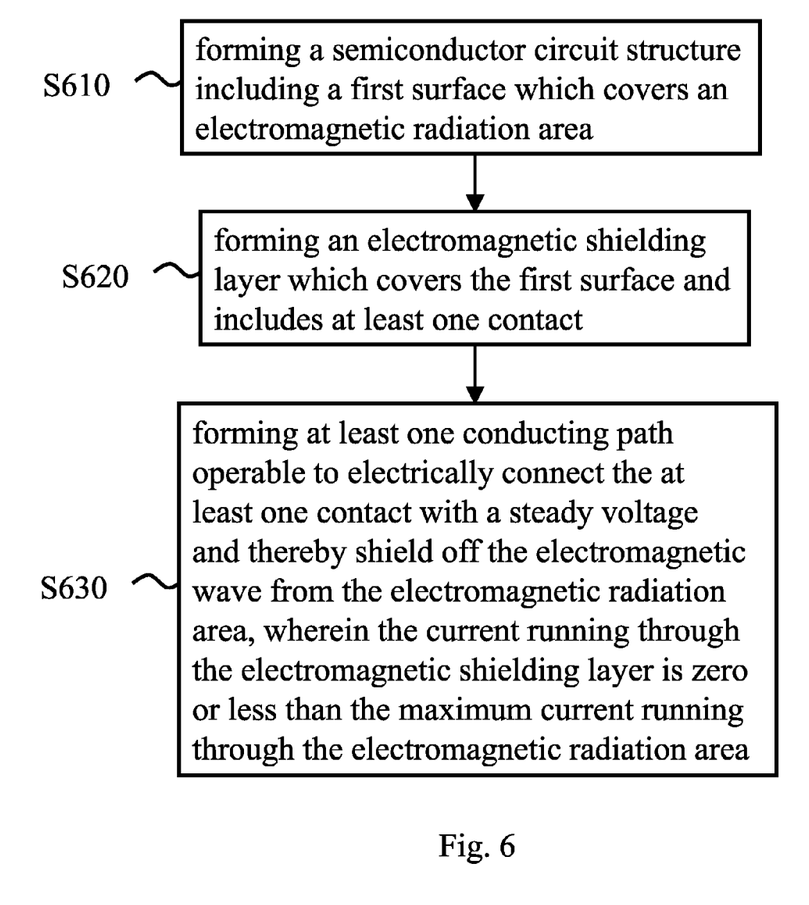
FIG. 6 illustrates an embodiment of the integrated circuit manufacturing method having electromagnetic shielding capability of the present invention.

In addition to the integrated circuit 100, the present invention also discloses an integrated circuit manufacturing method having electromagnetic shielding capability for making the integrated circuit 100 or the equivalent thereof. As it is shown in FIG. 6, an embodiment of this method comprises the following steps:

Step S610: forming a semiconductor circuit structure including a first surface which covers an electromagnetic radiation area. This step is operable to form the semiconductor circuit structure 110 of FIG. 1 or the modification thereof.

Step S620: forming an electromagnetic shielding layer which covers the first surface and includes at least one contact. For instance, the electromagnetic shielding layer is a metal layer, a wave-adsorbing layer, a composite layer of metal and wave-adsorbing materials or the like, and includes a plurality of contacts which are distributed over one side, several sides or the periphery of the electromagnetic shielding layer. This step is operable to form the electromagnetic shielding layer 120 of FIG. 1 or the modification thereof.

Step S630: forming at least one conducting path operable to electrically connect the at least one contact with a steady voltage and thereby shield off the electromagnetic wave from the electromagnetic radiation area, wherein the current running through the electromagnetic shielding layer is zero or less than the maximum current running through the electromagnetic radiation area. For instance, the at least one conducting path includes a plurality of conducting paths operable to electrically connect the plurality of contacts in step S620 with the steady voltage respectively. Furthermore, the current running through the electromagnetic shielding layer is zero or less than one-Nth of the above-mentioned maximum current in which the N could be 10 or a value capable of preventing the electromagnetic shielding layer from generating effectual electromagnetic waves. This step is operable to generate the conducting path 130 of FIG. 1 or the modification thereof.

In addition to the above steps, this embodiment may further comprises at least one of the following steps (not shown in the figures):

Step S640: forming an exposed pad, which is fixed to the semiconductor circuit structure directly or indirectly, and operable to electrically connect with the steady voltage, wherein the at least one conducting path is operable to electrically connect the at least one contact with the exposed pad and thereby make the least one contact be electrically connected with the steady voltage.

Step S650: forming at least one electromagnetic shielding pin operable to electrically connect with the steady voltage, wherein the at least one conducting path is operable to electrically connect the at least one contact with the electromagnetic shielding pin and thereby make the at least one contact be electrically connected with the steady voltage.

Step S660: forming a conductor at one or more sides of the electromagnetic shielding layer; and forming at least one electromagnetic shielding pin operable to electrically connect the conductor with the steady voltage, wherein the at least one conducting path is operable to electrically connect the at least one contact with the conductor and thereby make the at least one contact be electrically connected with the steady voltage.

Step S670: carrying out a packaging process for an integrated circuit through one of the following processes or the equivalent thereof: a Quad Flat No Leads (QFN) packaging process, a Quad Flat Package (QFP) packaging process, a Ball Grid Array (BGA) packaging process, and a Flip Chip packaging process.

Since those of ordinary skill in the art can appreciate the details and modifications of this embodiment by referring to the illustrations of FIG. 1 through FIG. 5*c*, which means that the embodiments and the features thereof pertaining to the aforementioned integrated circuit 100 can be reasonably adopted in this method embodiment, repeated and redundant description is therefore omitted while the remaining disclosure is believed to be enough for understanding and enablement.

Please note that each embodiment in this specification includes one or more features; however, this doesn't mean that one carrying out the present invention should make use of all the features of one embodiment at the same time, or should only carry out different embodiments separately. In other words, if an implementation derived from one or more of the embodiments is applicable, a person of ordinary skill in the art can selectively make use of some or all of the features in one embodiment or selectively make use of the combination of some or all features in several embodiments to have the implementation come true, so as to increase the flexibility of carrying out the present invention.

In summary, the integrated circuit and manufacturing method of the present invention are capable of electromagnetic shielding protection and can be realized through a known and simplified IC process (including a wire bonding process or an electrical-connection formation process), so that the present invention can resolve the electromagnetic interference problem in a cost-effective and space-saving manner, which is superior to the prior art in the cost and volume.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An integrated circuit having electromagnetic shielding capability, comprising:
   a semiconductor circuit structure including a first surface which covers an electromagnetic radiation area;
   an electromagnetic shielding layer covering the first surface and including at least one contact; and
   at least one conducting path operable to electrically connect the at least one contact with a steady voltage and thereby shield off the electromagnetic wave from the electromagnetic radiation area,
   wherein the current running through the electromagnetic shielding layer is zero or less than the maximum current running through the electromagnetic radiation area.

2. The integrated circuit of claim 1, wherein the semiconductor circuit structure further includes a second surface which is not covered with the electromagnetic shielding layer.

3. The integrated circuit of claim 2, wherein the second surface covers a radio-frequency circuit area.

4. The integrated circuit of claim 1, wherein the at least one contact includes a plurality of contacts, the at least one conducting path includes a plurality of conducting paths, and the plurality of contacts is electrically connected with the steady voltage through the plurality of conducting paths.

5. The integrated circuit of claim 4, wherein the electromagnetic shielding layer includes several sides while at least two of the contacts are formed at the same side of the several sides.

6. The integrated circuit of claim 4, wherein the electromagnetic shielding layer includes several sides while the plurality of contacts are distributed over at least two of the several sides.

7. The integrated circuit of claim 1, further comprising:
   an exposed pad, which is fixed to the semiconductor circuit structure directly or through at least one intermediate layer, and operable to electrically connect with the steady voltage,
   wherein the at least one conducting path is operable to electrically connect the at least one contact with the exposed pad and thereby make the least one contact be electrically connected with the steady voltage.

8. The integrated circuit of claim 1, further comprising:
   at least one electromagnetic shielding pin operable to electrically connect with the steady voltage,
   wherein the at least one conducting path is operable to electrically connect the at least one contact with the electromagnetic shielding pin and thereby make the at least one contact be electrically connected with the steady voltage.

9. The integrated circuit of claim 8, further comprising:
   a grounding pin which is different from the at least one electromagnetic shielding pin and operable to be coupled to a grounding voltage.

10. The integrated circuit of claim 1, wherein the electromagnetic shielding layer and a redistribution layer of the integrated circuit pertain to at the same layer.

11. The integrated circuit of claim 1, wherein the electromagnetic shielding layer is the outermost layer among all metal layers of the integrated circuit.

12. The integrated circuit of claim 1, wherein the current of the electromagnetic shielding layer is less than one-tenth of the maximum current running through the electromagnetic radiation area.

13. The integrated circuit of claim 1, wherein the electromagnetic radiation area is or includes:
   at least a part of a power and/or ground mesh.

14. The integrated circuit of claim 13, wherein the area of the electromagnetic shielding layer is more than the area of the power and/or ground mesh.

15. The integrated circuit of claim 1, which is set on a circuit board while the steady voltage comes from the circuit board.

16. An integrated circuit manufacturing method having electromagnetic shielding capability, comprising:
   forming a semiconductor circuit structure including a first surface which covers an electromagnetic radiation area;
   forming an electromagnetic shielding layer which covers the first surface and includes at least one contact; and
   forming at least one conducting path operable to electrically connect the at least one contact with a steady voltage and thereby shield off the electromagnetic wave from the electromagnetic radiation area,
   wherein the current running through the electromagnetic shielding layer is zero or less than the maximum current running through the electromagnetic radiation area.

17. The integrated circuit manufacturing method of claim 16, further comprising:
   forming an exposed pad, which is fixed to the semiconductor circuit structure directly or indirectly, and operable to electrically connect with the steady voltage,
   wherein the at least one conducting path is operable to electrically connect the at least one contact with the exposed pad and thereby make the least one contact be electrically connected with the steady voltage.

18. The integrated circuit manufacturing method of claim 16, further comprising:
   forming at least one electromagnetic shielding pin operable to electrically connect with the steady voltage,
   wherein the at least one conducting path is operable to electrically connect the at least one contact with the electromagnetic shielding pin and thereby make the at least one contact be electrically connected with the steady voltage.

19. The integrated circuit manufacturing method of claim 16, further comprising:
   forming a conductor at one or more sides of the electromagnetic shielding layer; and
   forming at least one electromagnetic shielding pin operable to electrically connect the conductor with the steady voltage,
   wherein the at least one conducting path is operable to electrically connect the at least one contact with the conductor and thereby make the at least one contact be electrically connected with the steady voltage.

20. The integrated circuit manufacturing method of claim 16, wherein the at least one contact includes a plurality of contacts, the at least one conducting path includes a plurality of conducting paths, and the plurality of contacts is electrically connected with the steady voltage through the plurality of conducting paths.

21. The integrated circuit manufacturing method of claim 16, further comprising:
   carrying out one of the following processes: a Quad Flat No Leads (QFN) packaging process, a Quad Flat Package (QFP) packaging process, a Ball Grid Array (BGA) packaging process, and a Flip Chip packaging process.

* * * * *